(12) United States Patent
Wong et al.

(10) Patent No.: US 7,407,875 B2
(45) Date of Patent: Aug. 5, 2008

(54) LOW RESISTANCE CONTACT STRUCTURE AND FABRICATION THEREOF

(75) Inventors: Keith Kwong Hon Wong, Wappingers Falls, NY (US); Patrick W. DeHaven, Poughkeepsie, NY (US); Sadanand V. Deshpande, LaGrangeville, NY (US); Anita Madan, Danbury, CT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/470,349

(22) Filed: Sep. 6, 2006

(65) Prior Publication Data
US 2008/0054326 A1    Mar. 6, 2008

(51) Int. Cl.
*H01L 21/20* (2006.01)
*H01L 21/44* (2006.01)
(52) U.S. Cl. ............... 438/548; 438/681; 257/E21.548
(58) Field of Classification Search ................. 257/300, 257/E21.584, E23.145; 438/584
See application file for complete search history.

(56) References Cited

U.S. PATENT DOCUMENTS

| | | | |
|---|---|---|---|
| 4,871,617 A | | 10/1989 | Kim et al. |
| 5,360,994 A | | 11/1994 | Wolters et al. |
| 5,529,670 A | * | 6/1996 | Ryan et al. ............. 204/192.15 |
| 5,565,708 A | * | 10/1996 | Ohsaki et al. ................ 257/764 |
| 5,610,099 A | * | 3/1997 | Stevens et al. .............. 438/626 |
| 5,654,233 A | * | 8/1997 | Yu ............................. 438/643 |
| 5,723,362 A | * | 3/1998 | Inoue et al. ................. 438/618 |
| 5,882,399 A | * | 3/1999 | Ngan et al. ................... 117/89 |
| 5,912,508 A | * | 6/1999 | Iacoponi ..................... 257/770 |
| 5,972,179 A | * | 10/1999 | Chittipeddi et al. .... 204/192.17 |
| 6,022,800 A | * | 2/2000 | Ho et al. ..................... 438/643 |
| 6,043,148 A | * | 3/2000 | Peng et al. .................. 438/628 |
| 6,057,231 A | * | 5/2000 | Givens et al. ............... 438/644 |
| 6,090,709 A | | 7/2000 | Kaloyeros et al. |
| 6,146,991 A | * | 11/2000 | Cheng et al. ................ 438/622 |
| 6,211,072 B1 | | 4/2001 | Brennan |
| 6,215,186 B1 | * | 4/2001 | Konecni et al. ............. 257/751 |
| 6,277,729 B1 | * | 8/2001 | Wu et al. .................... 438/627 |
| 6,365,510 B2 | | 4/2002 | Schmidbauer et al. |
| 6,767,812 B2 | * | 7/2004 | Abe et al. ................... 438/581 |
| 6,855,630 B1 | * | 2/2005 | Ruf et al. .................... 438/655 |
| 6,913,995 B2 | | 7/2005 | Ko |
| 6,998,275 B2 | | 2/2006 | Zhao et al. |
| 2002/0020922 A1 | | 2/2002 | Yamada et al. |
| 2003/0045091 A1 | | 3/2003 | Ryu et al. |
| 2003/0068894 A1 | * | 4/2003 | Iggulden et al. ............ 438/698 |

(Continued)

OTHER PUBLICATIONS

International Search Report and Written Opinion—FIS920060187. Date of Mailing—Mar. 12, 2007.

*Primary Examiner*—Bradley W. Baumeister
*Assistant Examiner*—Igwe U. Anya
(74) *Attorney, Agent, or Firm*—Yuanmin Cai

(57) ABSTRACT

Embodiments of the present invention provide a method of fabricating a contact structure in a layer of dielectric material between a semiconductor device and a back-end-of-line interconnect. The method includes creating at least one contact opening in said layer of dielectric material; forming a first TiN film through a chemical-vapor deposition process, said first TiN film lining said contact opening; and forming a second TiN film through a physical vapor deposition process, said second TiN film lining said first TiN film. A contact structure fabricated according to embodiments of the invention is also provided.

3 Claims, 8 Drawing Sheets

U.S. PATENT DOCUMENTS

2005/0221612 A1* 10/2005 Brown et al. ............... 438/643
2006/0076680 A1 4/2006 Williams et al.
2006/0148242 A1* 7/2006 Kim ......................... 438/637
2007/0222066 A1* 9/2007 Cabral et al. ............... 257/734

* cited by examiner

LOW RESISTANCE CONTACT STRUCTURE AND FABRICATION THEREOF

FIELD OF THE INVENTION

The present invention relates to manufacture of semiconductor chips. Specifically, it relates to middle-of-the-line contact structures, interfacing between active semiconductor devices and overlying interconnects, and fabrication thereof.

BACKGROUND OF THE INVENTION

In semiconductor industry, tungsten (W) is primarily used as middle-of-the-line (MOL) contact material because of its relatively low resistance, less stress, and electro-migration properties. A MOL contact may be a conductive stud working as an interface between contact areas of an active semiconductor device (or integrated circuit), which may be referred to as front-end-of-the-line (FEOL), and its overlying interconnects or interconnecting structures, which may be referred to as back-end-of-the-line (BEOL). Contact areas of an active semiconductor device may be made of, for example, silicide material. MOL contacts are usually formed in a layer of dielectric material, for example, $SiO_2$ formed on top of the active semiconductor device. The layer of dielectric material has openings, wherein MOL contacts are formed, extending to the surfaces of the contact areas of underlying semiconductor device.

It is well known in the art that, due to a high aspect ratio (a ratio of depth to width) greater than, for example, three (3) and small feature sizes (on the order of about 0.1 microns or less), a chemical vapor deposition (CVD) process is generally applied in depositing W into the openings in the dielectric material to form the MOL contact. The deposition process is typically performed in two or more steps, for example, a nucleation step and a bulk fill step.

During the nucleation step, $WF_6$ and a silane, for example $SiH_4$, may be used as precursors. Recently, $B_2H_6$ is used in the reduction of $WF_6$ and a chemical reaction as follows may occur:

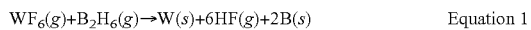

$$WF_6(g)+B_2H_6(g)\rightarrow W(s)+6HF(g)+2B(s) \quad \text{Equation 1}$$

During the bulk fill step, $WF_6$ and $H_2$ are used and the following chemical reaction may occur:

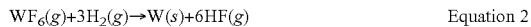

$$WF_6(g)+3H_2(g)\rightarrow W(s)+6HF(g) \quad \text{Equation 2}$$

It shall be noted that in the above equations, (g), denoting gas, and (s), denoting solid, are used to indicate the state of the chemical material used or produced during the reaction process.

From the above chemical reaction equations 1 and 2, it is apparent that the process of CVD deposition of W may produce, as a by-product, HF, which is well-known to be corrosive to silicon. To protect silicon (Si) inside the silicide from corrosive reaction, a liner may be deposited prior the CVD deposition of W. The use of the liner may additionally reduce a contact resistance between the silicide contact areas and the CVD-deposited W contact and function as an adhesive layer between the CVD-deposited W and the dielectric material wherein contact openings are created.

Various different types of liners are known in the prior art. For example, one widely used liner may include a Ti/CVD TiN stack. Ti (titanium) is known to be a good oxygen "getter" (that is, Ti has a high affinity for oxygen) and thus the application of a Ti layer helps clean up surface oxide of contact openings. The stack also includes a layer of CVD-deposited TiN, on top of the Ti layer, to provide coverage of the bottom and corners of the contact openings. The CVD-deposited TiN layer helps prevent the formation of volcano defects, which otherwise would occur as a result of reaction of exposed Ti and/or Si with $WF_6$ during the nucleation and/or bulk fill steps.

Although Ti/CVD TiN stack liner may prevent silicide contact areas of a semiconductor device, such as, a source and/or drain and/or gate region, from getting in contact with corrosive HF produced during CVD deposition of W for stud contact, the existence of CVD-deposited TiN in the stack promotes the formation of beta-W, which is known to have a high resistance, causing increase in overall resistance of stud contact. In view of the above, there is a need to develop MOL contact structures that will overcome the drawbacks as mentioned above.

SUMMARY OF THE INVENTION

Embodiments of the present invention provide a method of fabricating a contact structure in a layer of dielectric material between a semiconductor device and a back-end-of-line interconnect. The method includes creating at least one contact opening in the layer of dielectric material; forming a first TiN film through a chemical-vapor deposition process, the first TiN film lining the contact opening; and forming a second TiN film through a physical vapor deposition process, the second TiN film lining the first TiN film.

According to one embodiment, forming the second TiN film may include directionally sputtering a layer of TiN onto the first TiN film, the layer of TiN having a thickness ranging from about 10 Å to about 150 Å at a bottom and from about 5 Å to about 25 Å on sidewalls of the contact opening.

According to another embodiment, forming the second TiN film may include directionally sputtering a layer of Ti onto the first TiN film and subsequently converting the layer of Ti into the second TiN film through a post-deposition process. The post-deposition process may include a forming gas annealing treatment, using a gas mixture of about 5-10% atomic $H_2$ and 90-95% atomic $N_2$, at a temperature of about 500° C. to about 650° C., for about 15 minutes to about 1 hour. Alternatively, the post-deposition process comprises a forming gas plasma process of $H_2$ and $N_2$ performed for about 5 seconds to about 30 seconds.

Additionally, embodiments of the invention also provide a method of depositing a Ti liner, before forming the first TiN film, in the contact opening, the Ti liner having a thickness ranging from about 20 Å to about 400 Å. Embodiments of the invention further provide a method of filling the contact opening with a conductive material, preferably tungsten (W), through a chemical vapor deposition process to form a contact plug.

Embodiments of the present invention also provide a structure interfacing a semiconductor device and a back-end-of-line interconnect. The structure may include at least one contact opening in a layer of dielectric material; a first liner formed along the contact opening, the first liner being a chemical vapor deposited (CVD) TiN film and thus possessing properties of a CVD-TiN film; and a second liner formed on top of the first liner, the second liner being a physical vapor deposited (PVD) TiN film and thus possessing properties of a PVD-TiN film.

BRIEF DESCRIPTION OF THE DRAWINGS

The present invention will be understood and appreciated more fully from the following detailed description of the invention, taken in conjunction with the accompanying drawings of which.

Figure 1:
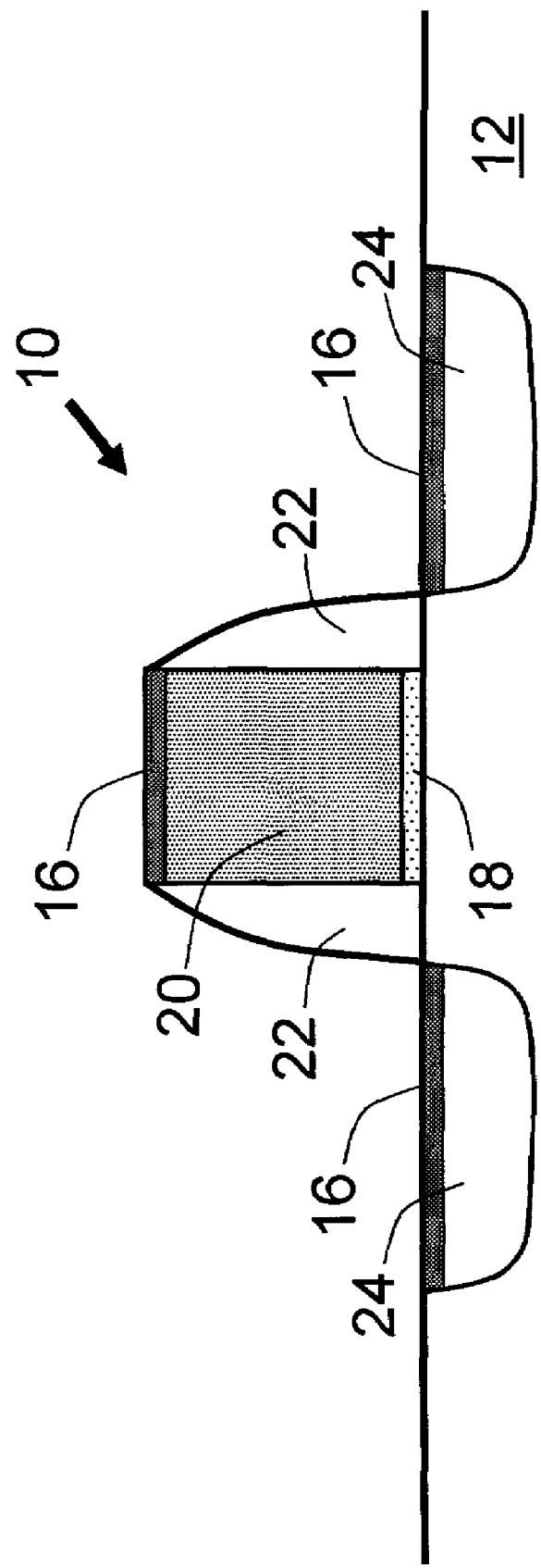
FIGS. 1-7 are simplified illustrations of a method of forming a stud contact structure according to embodiments of the invention.

It will be appreciated that for simplicity and clarity of illustration, elements shown in the drawings have not necessarily been drawn to scale. For example, the dimensions of some of the elements may be exaggerated relative to other elements for clarity.

DETAILED DESCRIPTION OF THE INVENTION

In the following description, numerous specific details are set forth, such as particular structures, components, materials, dimensions, processing steps and techniques, in order to provide a thorough understanding of the present invention. However, it will be appreciated by one of ordinary skill in the art that the invention may be practiced without these specific details. In other instances, well-known structures or processing steps have not been described in detail in order to avoid obscuring description of the present invention.

Throughout this application, the term "semiconductor" may be used from time to time to denote a semiconductor material or combination thereof including, for example, Si, SiGe, SiGeC, SiC, Ge alloys, GaAs, InAs, InP and other III/V or II/VI compound semiconductors. The term "semiconductor substrate" may be used from time to time to denote a layered structure of semiconductor materials such as, for example, Si/SiGe, Si/SiC, silicon-on-insulator (SOI) or silicon-germanium-on-insulator (SGOI). A semiconductor substrate may be doped, undoped or contain doped and/or undoped regions therein; may be strained, unstrained or contain strained and/or unstrained regions therein; may have a single crystal orientation or regions of different crystallographic orientations therein; and may have one or more isolation regions such as, for example, trench isolation regions or field oxide isolation regions, located therein.

FIG. 1 is a simplified illustration of a semiconductor device 10, upon which one or more middle-of-the-line (MOL) stud contact structures may be later formed in accordance with embodiments of the present invention. Semiconductor device 10 may be, for example, a field effect transistor (FET). However, the present invention is not limited in this respect and may be applied in forming contact structures for other semiconductor devices such as, for example, capacitors, diodes, bipolar transistors, BiCMOS devices, memory devices and the like. Hereinafter, semiconductor device 10 may be referred to as FET 10 for easy reference.

FET 10 may be fabricated by any conventional semiconductor processing techniques that may be well known in the art. For example, deposition, lithography, etching, and ion implantation techniques, among others, may be used. FET 10 may be formed on a semiconductor substrate 12 to include a gate dielectric 18, a gate conductor 20, a pair of optional offset spacers 22, and source/drain regions 24. FET 10 may also include one or more contact areas 16 that are formed atop of source/drain regions 24 and/or gate contact 20, upon which stud contact structure may be formed. Contact areas 16 may include silicide such as NiSi, $CoSi_2$, TiSi, and/or $WSi_x$.

Figure 2:
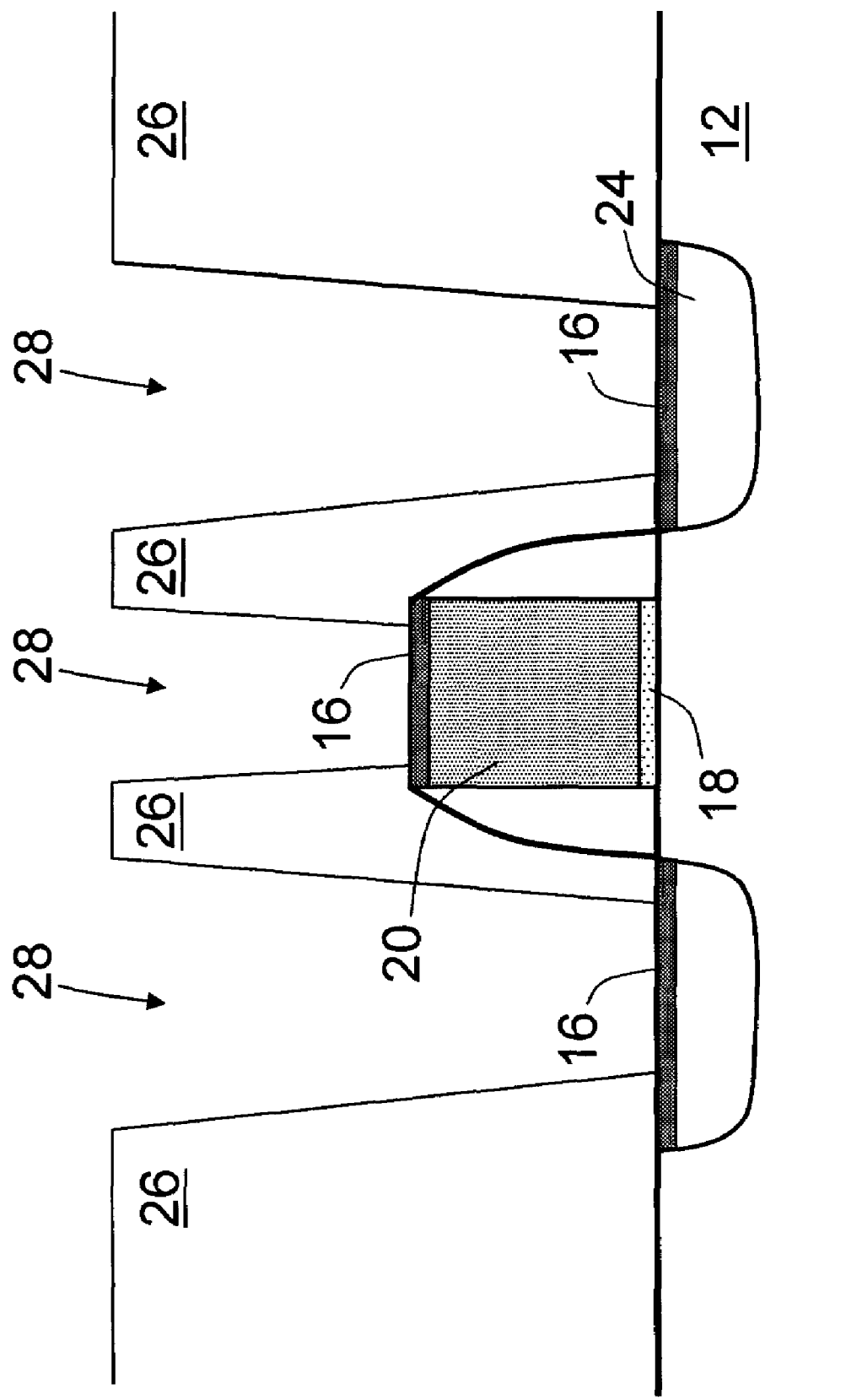

FIG. 2 is a simplified illustration of a layer of dielectric material 26 formed on top of FET 10. Dielectric material 26 may include one or more stud contact openings 28 formed therein. As is shown in FIG. 2, stud contact openings 28 may extend to and expose the top surface of silicide contact areas 16. Stud contact openings may be formed through well-known technique, such as a reactive-ion-etching (RIE) process, and in a shape of substantially vertical or have some tapering as shown in FIG. 2. Stud contact openings 28 may have a high aspect ratio (ratio of depth to width) of greater than three (3), for example. However, the present invention is not limited in this respect and may be applied to other stud contact openings of a higher or lower aspect ratio. Dielectric material 26 may be porous or non-porous. Some examples of dielectrics material 26 may include, but are not limited to: $SiO_2$, a doped or undoped silicate glass, C doped oxides (i.e., organosilicates) that include atoms of Si, C, O and H, thermosetting polyarylene ethers, or multilayers thereof, silicon nitride, silicon oxynitride or any combination, including multilayers thereof. Other dielectric material 26 may be used.

According to one embodiment of the invention, at this stage of forming a stud contact structure, the exposed surface of the silicide contact area 16 as well the wall surfaces within the contact opening 28 may be subjected to a treatment process that is capable of removing any surface oxide or etch residue that may be present thereon. Suitable treatment processes that can be employed in the present invention include, for example, Ar sputtering and/or contacting with a chemical etchant. Some negligible widening of the contact opening 28 may occur during this step of the present invention.

Figure 3:
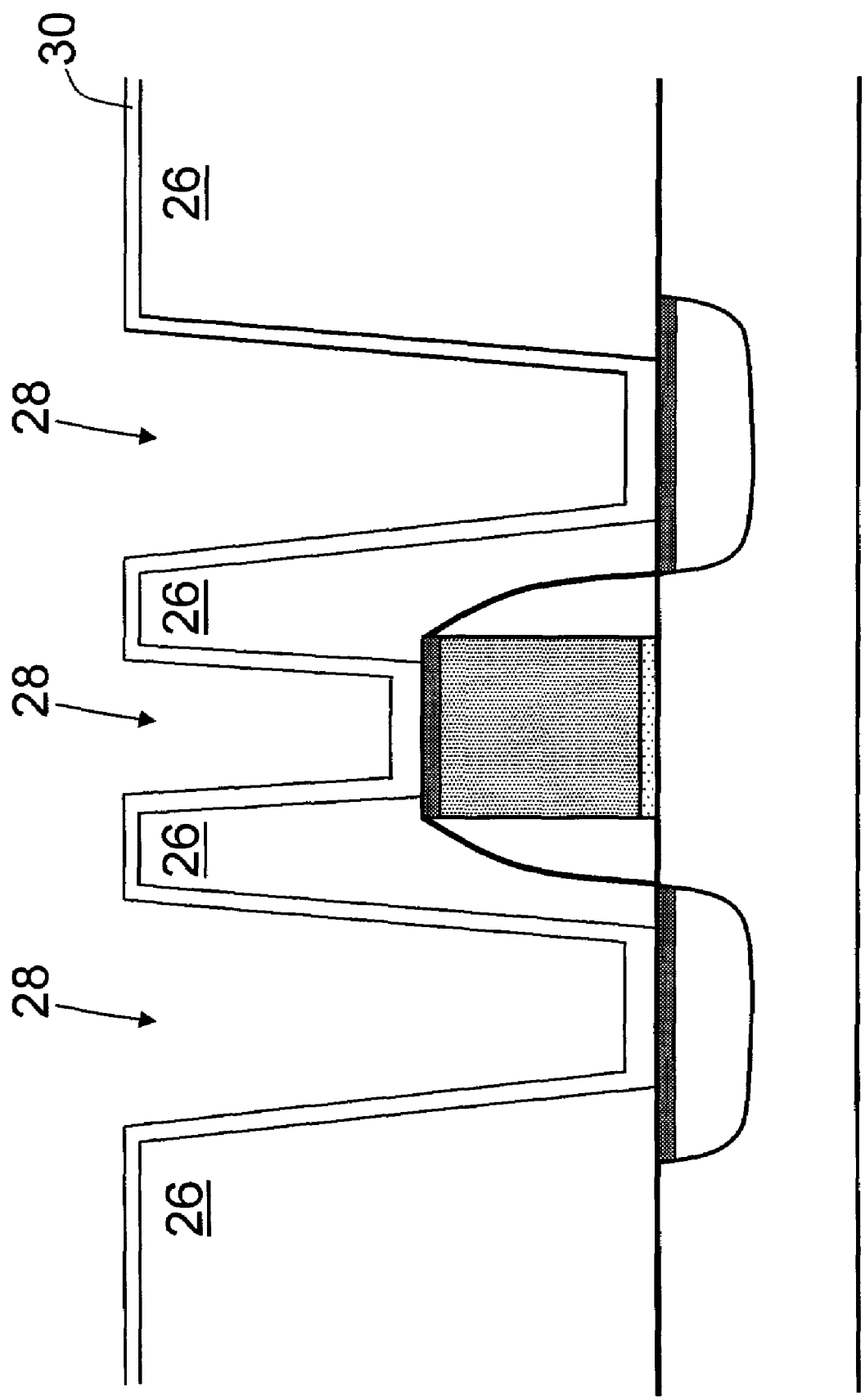

Next, as is shown in FIG. 3, an "oxygen-getter" layer 30 may be formed within stud contact opening 28 on the exposed wall portions thereof as well as atop the exposed surface of silicide contact areas 16. Oxygen-getter layer 30 may be a thin layer of Ti, W, Ta, or any other material that has a high affinity for oxygen, with Ti being generally preferred. Oxygen-getter layer 30 may be deposited by applying a sputtering process such as, for example, a physical vapor deposition (PVD) process. Other processes of deposition such as a chemical vapor deposition (CVD) process may be used. The thickness of oxygen-getter layer 30 may vary depending on the deposition process used as well as the material used. Typically, oxygen-getter layer 30 has a thickness from about 2 nm to about 40 nm, with a thickness from about 5 nm to about 10 nm being more typical.

Figure 4:
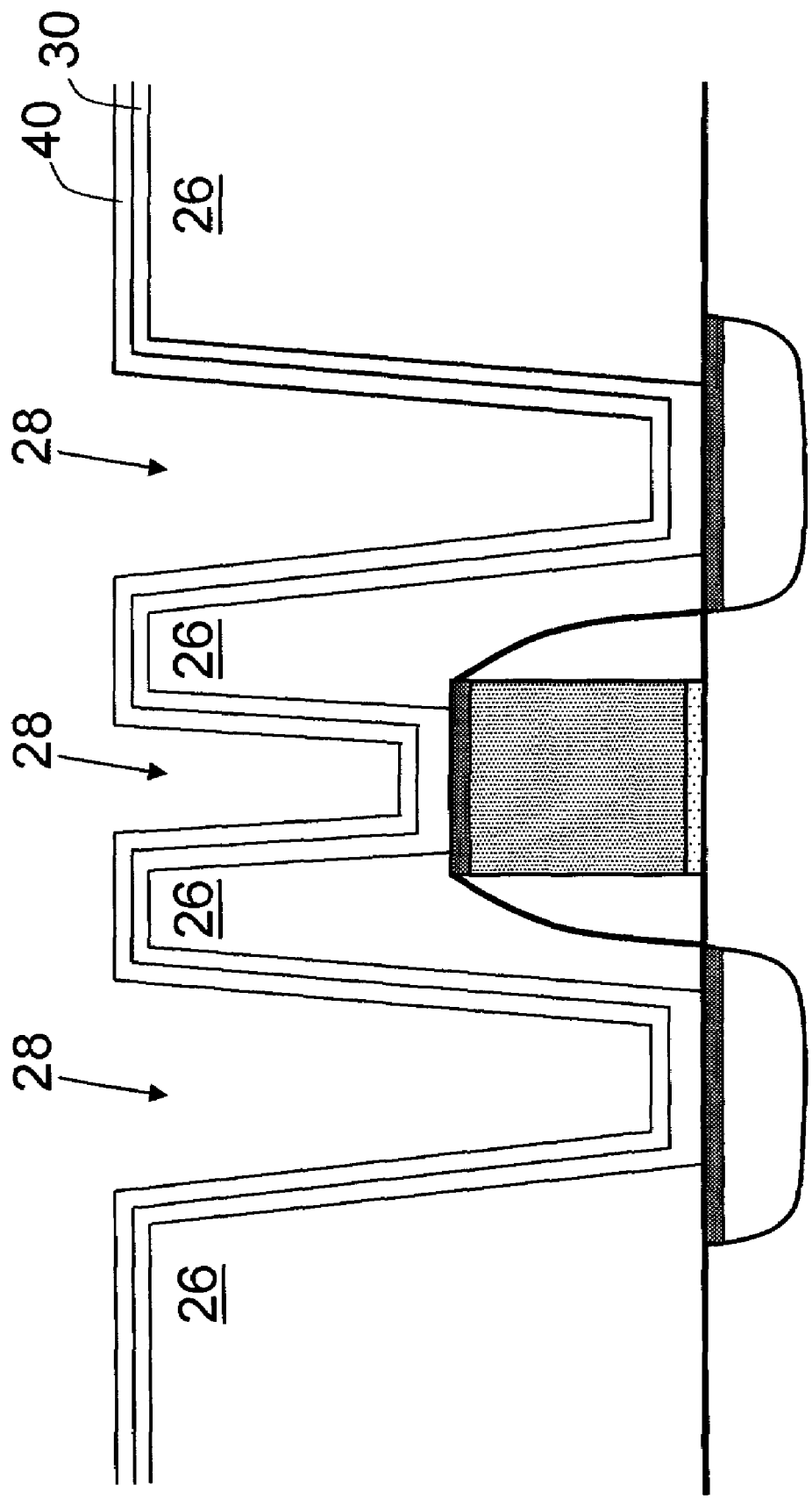

Next, as is shown in FIG. 4, a diffusion barrier layer 40 may be formed. Diffusion barrier layer 40 may be conformal and formed within stud contact openings 28 on surface of oxygen-getter layer 30. Diffusion barrier layer 40 may be deposited through a chemical vapor deposition (CVD) process. For example, diffusion barrier layer 40 may be formed by applying a TDMAT (Tetrakis-dimethylamido titanium) process or a TDEAT (Tetrakis-diethylamido titanium) process.

Diffusion barrier layer 40 may typically have a thickness from about 2 nm to about 10 nm with a thickness from about 5 nm to about 8 nm being more typical. The formation of diffusion barrier layer 40 may be optionally followed by a post-deposition forming gas plasma treatment. Diffusion barrier layer 40 may prevent oxygen-getter layer 30 and portions of silicon underneath, which may be still exposed, from reacting with a gas of HF, which may be a byproduct during a subsequent CVD deposition of W and be corrosive to Ti and Si.

Figure 5:
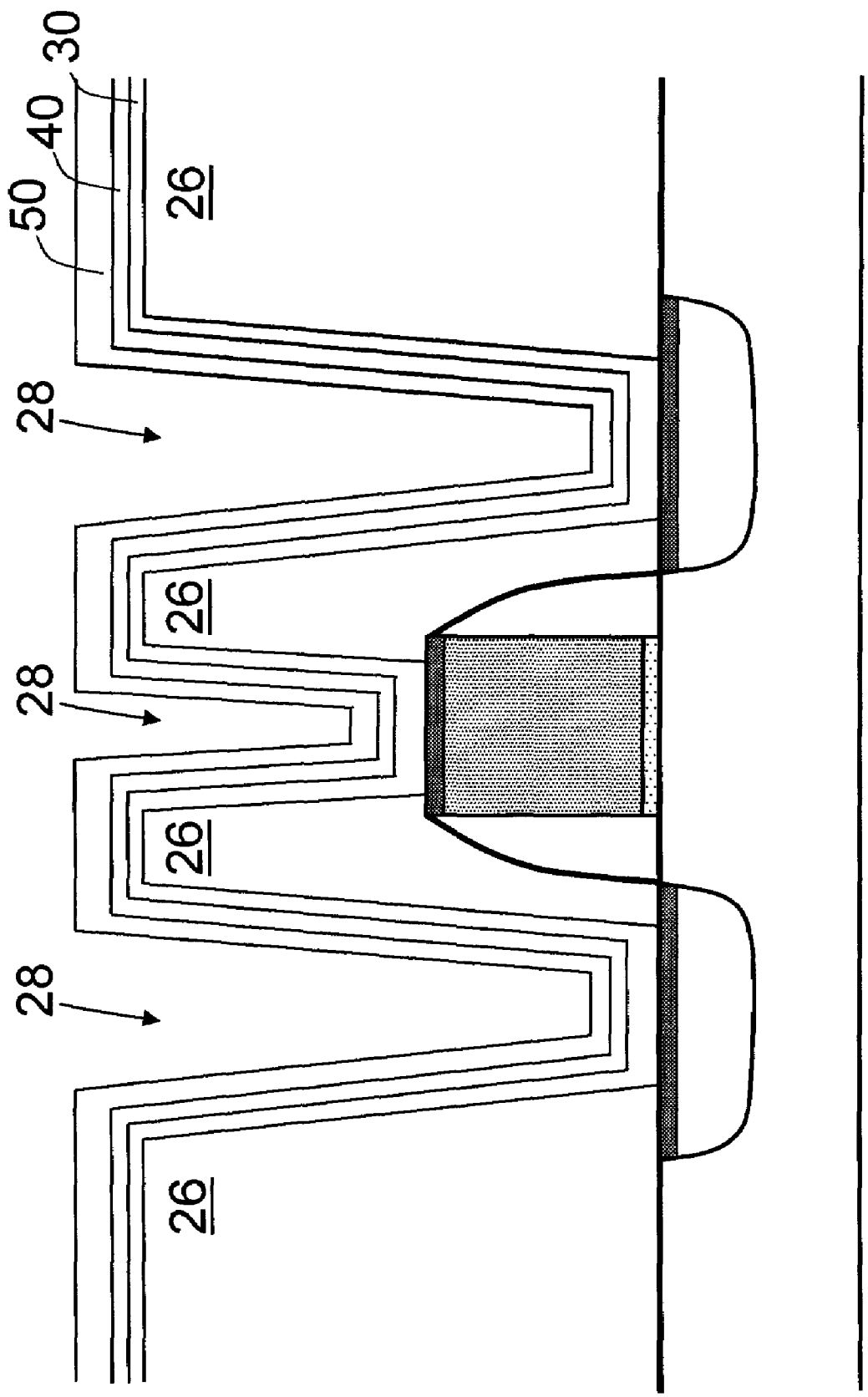

FIG. 5 illustrates that following formation of oxygen-getter layer 30 and diffusion barrier layer 40, according to one embodiment of the present invention a TiN layer 50 may be formed in stud contact openings 28 before W stud contact is filled therein. TiN layer 50, formed following processes in accordance with embodiments of the present invention as described below in detail, may reduce, eliminate, and/or prevent the creation of beta-W during the process of forming W stud contact and therefore significantly reduce contact resistance associated with the beta-W.

According to one embodiment of the invention, TiN layer 50 may be formed on top of diffusion barrier layer 40 through directional reactive sputtering Ti, in an environment of mixed gases of Ar and $N_2$, onto stud contact openings 28. In other words, TiN layer 50 may be a PVD-deposited TiN layer and therefore may be referred to from time to time as a PVD TiN layer. PVD-deposited TiN layer may be non-conformal, and may generally have a film thickness on the sidewalls less than that at the bottom of stud contact opening 28. The film thickness at the bottom in turn may be less than that in the field area above stud contact opening 28. For example, TiN material may be directionally sputtered to produce a film or a layer of TiN with a thickness ranging from about 10 Å to about 150 Å at the bottom, and from about 5 Å to about 25 Å on the sidewalls, of stud contact openings 28.

According to another embodiment of the invention, TiN layer 50 may be formed on top of diffusion barrier layer 40 by directionally sputtering a layer of Ti onto stud contact openings 28 initially. The deposition of Ti may be followed by a post-deposition treatment process that consequently converts deposited Ti into TiN. According to one embodiment, the treatment process may be a forming gas annealing process using a mixed gases of about 5-10% atomic $H_2$ and 90-95% atomic $N_2$, although the present invention is not limited in this respect and lower than 5% or higher than 10% of atomic $H_2$ (and corresponding amount of $N_2$) may also be used to achieve similar results. The forming gas annealing process may be performed at a temperature of about 500° C. to about 650° C. for a time period of about 15 minutes to about 1 hour. However, the present invention is not limited in this respect and temperatures below 500° C. or higher 650° C., and longer or shorter time period may possibly be used. According to yet another embodiment, the treatment process may be a plasma treatment in a forming gas environment of $H_2$ and $N_2$, performed for a much shorter time period of about 5 second to about 30 seconds, to convert deposited Ti into TiN. Other suitable methods of converting deposited Ti into TiN may be used as well.

According to embodiments of the invention, the existence of PVD-TiN layer 50 in stub contact openings 28 may reduce and/or eliminate the creation of beta-W during a process of CVD deposition of W in a subsequent step of forming W stud contact. The reduction and/or elimination of beta-W may improve the performance of W stud contact because beta-W is known of having a high resistance and otherwise may cause device performance degradation. Additionally, PVD-TiN layer 50 does not change as much as a CVD-TiN, such as CVD-TiN 40, which allows a longer queue time window in-between liner/barrier deposition and CVD-deposition of W.

Figure 6:
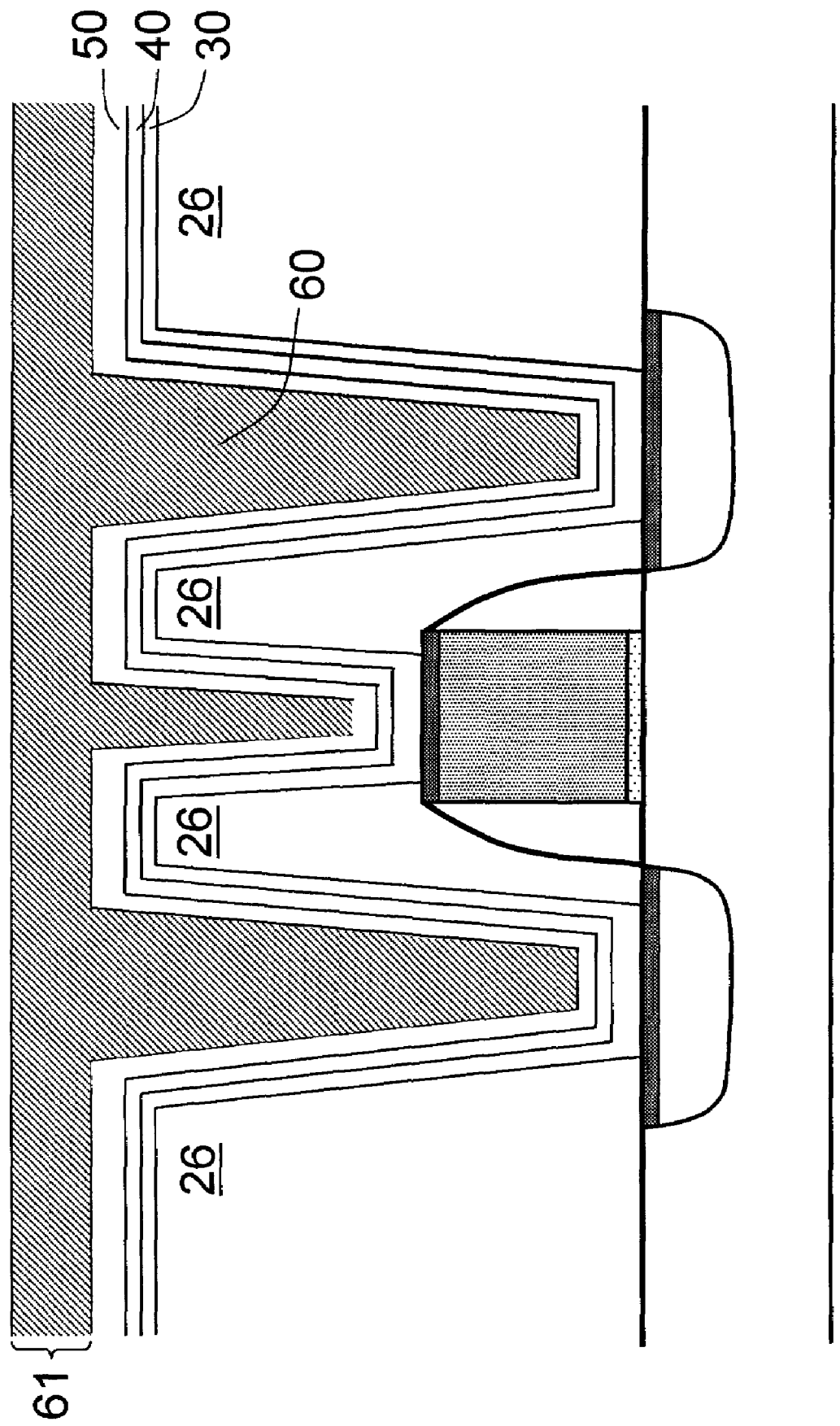

FIG. 6 illustrates that stud contact openings 28 are lined by a stack of Ti/CVD-TiN/PVD-TiN layer, and then deposited with tungsten (W) to form W stud contact 60. The deposition of W may be through any well known processes such as, for example, a CVD process. The deposition of W may overfill stud contact openings 28 to form a tungsten layer 61. The deposition may be in two or more steps, for example, a nucleation step and a bulk-fill step as described above with equations 1 and 2.

Figure 7:
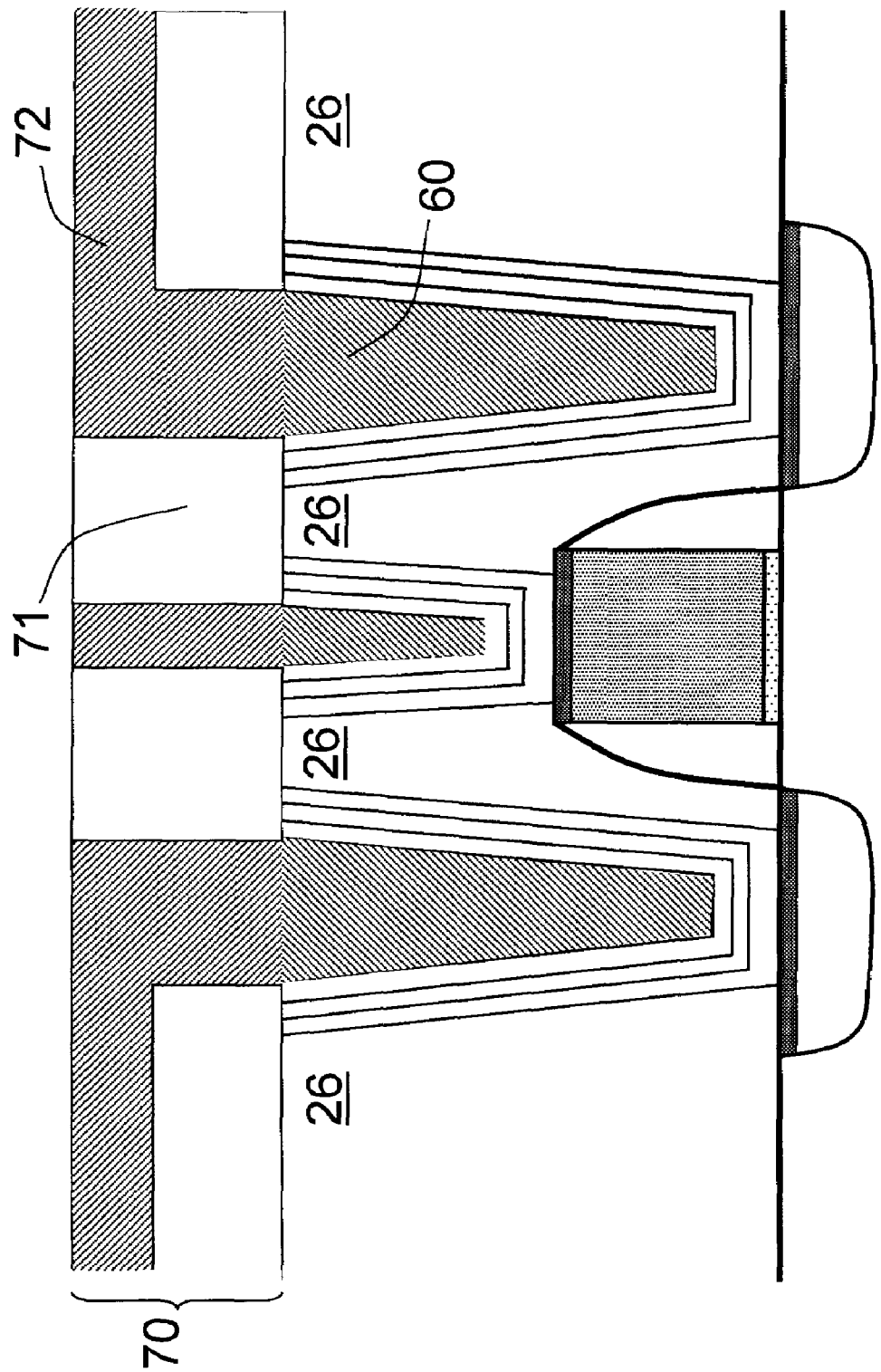

FIG. 7 illustrates a semiconductor structure with a finished middle-of-line stud contact structure in accordance with one embodiment of the invention. Following the deposition step as shown in FIG. 6, excessive tungsten 61 that is above and over stud contact openings 28 may be removed by, for example, any conventional planarization technique such as a chemical mechanical polishing (CMP) process. Next, liner stack of Ti/CVD-TiN/PVD-TiN (i.e., PVD-TiN layer 50, CVD-TiN layer 40, and Ti layer 30) that are on top of dielectric material 26 may be removed by for example applying a CMP process as well and by applying different types of slurry in the CMP process. Different slurries may be suitable for removing different liners. FIG. 7 further illustrate that a layer of interconnect structure 70 may be formed on top of dielectric material 26 and on stud contacts 60. Interconnect structure 70 may include an inter-level dielectric material 71 and conductive trench and/or via 72. Inter-level dielectric material 71 may be the same or different, preferably the same, dielectric as that of dielectric material 26. Interconnect structure 70 may be formed following conventional process. For example, a conventional via-before-line or a line-before-via process may be used. Between interconnect structure 70 and dielectric material layer 26, a dielectric capping layer (not shown) may be formed.

Figure 8:
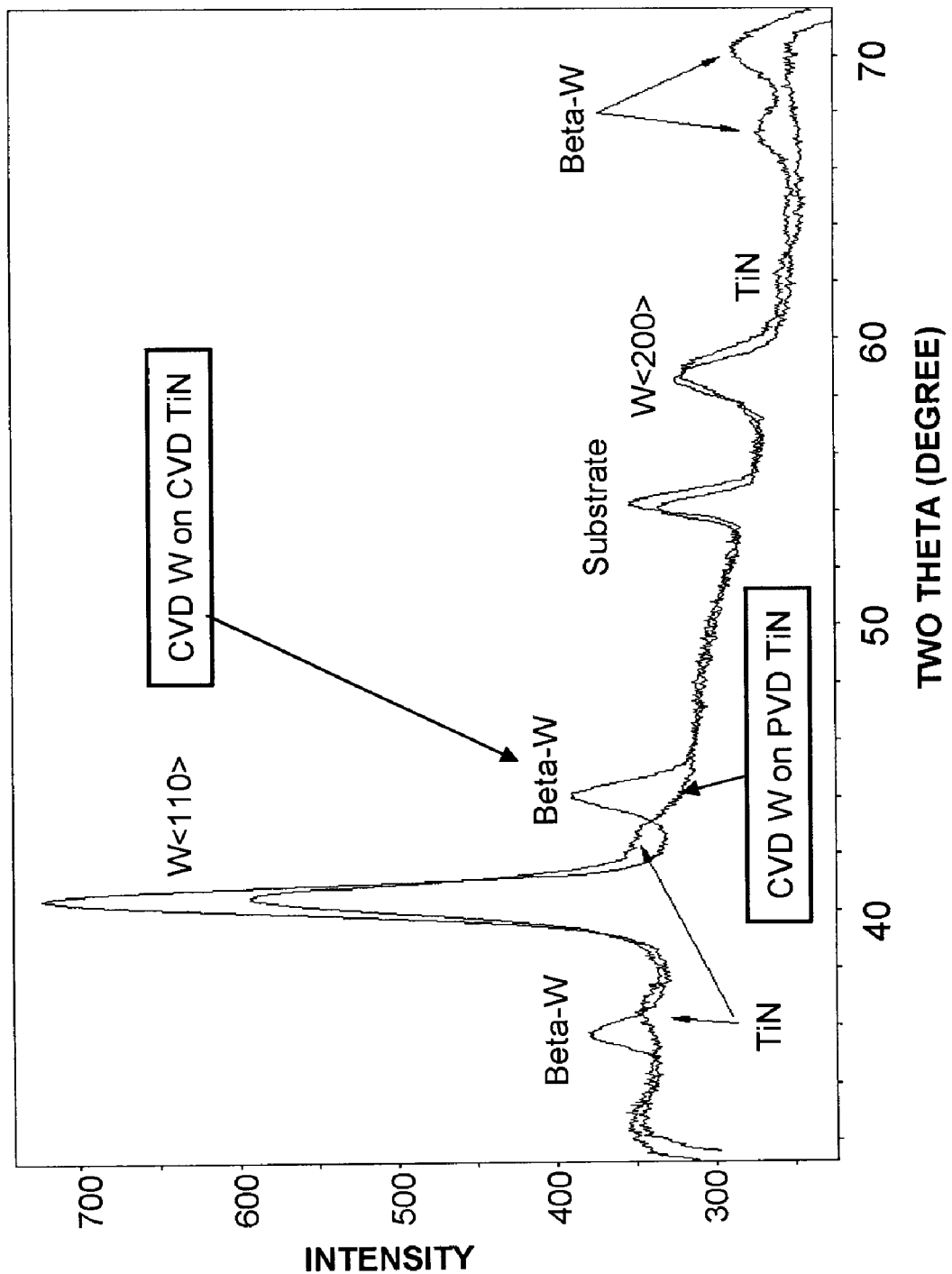
FIG. 8 is a sample test result of x-ray diffraction of a stud contact structure formed according to one embodiment of the invention, compared with that of a stud contact structure formed conventionally.

FIG. 8 is sample illustration of test results of X-ray diffraction patterns measured from a stack of contact films, suitable for stud contact structure, fabricated in accordance with one embodiment of the invention as well as X-ray diffraction patterns measured from a stack of contact films fabricated by a conventional method. The diffraction patterns clearly indicate the presence of beta-W diffraction peaks on a CVD W film which was deposited on a CVD TiN directly. However, when the CVD W film is deposited on a PVD TiN, no obvious peaks of beta-W were detected, indicating the absence of beta-W in the formed W film and therefore potential reduction in resistance.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A method of fabricating a contact structure in a layer of dielectric material between a semiconductor device and a back-end-of-line interconnect, the method comprising:

creating at least one contact opening in said layer of dielectric material, said at least one contact opening exposes a suicide contact surface of said semiconductor device;

forming a first TiN film through a chemical-vapor deposition process, said first TiN film lining said contact opening; and forming a second TiN film through a physical vapor deposition process, said second TiN film lining said first TiN film, wherein forming said second TiN film comprises directionally sputtering a layer of Ti onto said first TiN film and subsequently converting said layer of Ti into said second TiN film though a post-deposition process; and wherein said post-deposition process comprises a forming gas annealing treatment, using a gas mixture of about 5-10% atomic $H_2$ and 90-95% atomic $N_2$, at a temperature of about 500° C. to about 650° C., for about 15 minutes to about 1 hour.

2. A method of fabricating a semiconductor structure, the method comprising:

fabricating at least one semiconductor device; and fabricating one or more stud contact structure interfacing with one or more contact areas of said semiconductor device, wherein said fabricating one or more stud contact structure comprises:
  forming one or more openings in a layer of dielectric material, at least one of said openings exposes a silicide contact surface of said semiconductor device;
  applying a chemical vapor deposition (CVD) process to create a first TiN liner over said at least one of said openings;
  applying a physical vapor deposition (PVD) process to create a second TiN liner over said first TiN liner; and
  filling said at least one of said openings, on top of said second TiN liner, with a conductive material.
wherein creating said second TiN liner comprises sputter-depositing a layer of Ti onto said first TiN liner, and converting said layer of Ti into said second TiN liner through a forming gas annealing process, using a gas mixture of about 5-10% atomic $H_2$ and 90-95% atomic $N_2$, at a temperature of about 500° C. to about 650° C, and for about 15 minutes to about 1 hour.

3. A method of creating a structure, comprising:
  fabricating at least one contact opening in a layer of dielectric material on top of a semiconductor device, said contact opening exposes a silicide contact surface of said semiconductor device;
  forming a first TiN film through a chemical vapor deposition process, said first TiN film lining said contact opening;
  forming a second TiN film through a physical vapor deposition process, said second TiN film lining said first TiN film; and
  filling said contact opening, on top of said second TiN film, with a conductive material,
wherein forming said second TiN liner comprises directionally sputtering Ti onto said first TiN liner and subsequently converting said sputtered Ti into said second TiN liner through a post-deposition treatment.

* * * * *